United States Patent
Pachler

(10) Patent No.: US 9,520,382 B2
(45) Date of Patent: Dec. 13, 2016

(54) RETROFIT LED LAMP WITH WARM-WHITE, MORE PARTICULARLY FLAME-LIKE WHITE LIGHT

(75) Inventor: Peter Pachler, Graz (AT)

(73) Assignee: Tridonic Jennersdorf GmbH, Jennersdorf (AT)

( * ) Notice: Subject to any disclaimer, the term of this patent is extended or adjusted under 35 U.S.C. 154(b) by 766 days.

(21) Appl. No.: 13/511,558

(22) PCT Filed: Nov. 29, 2010

(86) PCT No.: PCT/EP2010/068413
§ 371 (c)(1),
(2), (4) Date: May 23, 2012

(87) PCT Pub. No.: WO2011/064363
PCT Pub. Date: Jun. 3, 2011

(65) Prior Publication Data
US 2012/0242245 A1    Sep. 27, 2012

(30) Foreign Application Priority Data

Nov. 30, 2009  (DE) .......... 10 2009 056 114
Feb. 25, 2010  (DE) .......... 10 2010 002 332

(51) Int. Cl.
*H05B 41/16*      (2006.01)
*H05B 41/24*      (2006.01)
(Continued)

(52) U.S. Cl.
CPC .......... *H01L 25/075* (2013.01); *F21K 9/23* (2016.08); *F21Y 2101/00* (2013.01);
(Continued)

(58) Field of Classification Search
CPC .................................. H05B 37/02
(Continued)

(56) References Cited

U.S. PATENT DOCUMENTS

| 6,234,648 | B1 * | 5/2001 | Borner | C09K 11/584 |
| | | | | 313/312 |
| 6,577,073 | B2 * | 6/2003 | Shimizu | H01L 25/0753 |
| | | | | 257/89 |

(Continued)

FOREIGN PATENT DOCUMENTS

| CN | 201126821 Y | * 10/2008 |
| HK | CN 201126821 Y | * 10/2008 |

OTHER PUBLICATIONS

International Search Report issued in connection with the corresponding International Application No. PCT/EP2010/068413 on Feb. 28, 2011.

(Continued)

*Primary Examiner* — Lincoln Donovan
*Assistant Examiner* — Metasebia Retebo
(74) *Attorney, Agent, or Firm* — The H.T. Than Law Group

(57) ABSTRACT

The invention relates to an LED lamp for warm white light having an LED module consisting of at least one color-converted blue or UV LED, and at least one monochromatic LED, preferably a red LED, in the case of which the mixed spectrum produces white light with a color temperature CCT of between 1500K and 2400K, preferably 1700K and 2100K at room temperature, and between 1800K and 2400K, preferably 2100K and 2300K at a stationary operating temperature of, for example, between 70° C. and 80° C. of the LED lamp.

17 Claims, 2 Drawing Sheets

(51) Int. Cl.
*H01L 25/075* (2006.01)
*H01L 33/50* (2010.01)
*F21Y 101/00* (2016.01)

(52) U.S. Cl.
CPC ........ *F21Y 2113/13* (2016.08); *F21Y 2115/10* (2016.08); *H01L 33/50* (2013.01); *H01L 2924/0002* (2013.01)

(58) Field of Classification Search
USPC .................................................. 315/250, 312
See application file for complete search history.

(56) References Cited

U.S. PATENT DOCUMENTS

| | | |
|---|---|---|
| 2005/0127381 A1 | 6/2005 | Vitta et al. |
| 2006/0152140 A1 | 7/2006 | Brandes |
| 2010/0277059 A1* | 11/2010 | Rains, Jr. ............... B82Y 30/00 313/502 |
| 2010/0289044 A1* | 11/2010 | Krames ................. C09K 11/08 257/98 |
| 2011/0057227 A1 | 3/2011 | Oberleithner |
| 2011/0115406 A1* | 5/2011 | Wang ................ H05B 33/0812 315/294 |

OTHER PUBLICATIONS

Translated Abstract for CN 201126821 Y.

* cited by examiner

Spectra by comparison with candle light:

1: Red LED and blue LED, with green/yellow phosphor
2: Red LED and blue LED, with yellow phosphor
3: Red LED and blue LED, with yellow/red phosphor
4: Spectrum of candle light

RETROFIT LED LAMP WITH WARM-WHITE, MORE PARTICULARLY FLAME-LIKE WHITE LIGHT

BACKGROUND OF THE INVENTION

The present invention relates entirely generally to so-called retrofit LED lamps. What is understood by this from an expert is an LED lamp which is provided with a cap which enables said lamp to be used as replacement luminous means in existing standardized holders for halogens or incandescent bulb lamps.

The supply of electricity to such a lamp is ensured by a low voltage (for example 12V/24V) AC voltage and DC voltage, or by 110V/220V AC voltage. Such retrofit LED lamps are distinguished by the fact that a converter or driver circuit for the one or more LEDs is arranged in the LED lamp inside the housing, preferably in the region of the cap of the LED lamp. Since the driver circuit and the LEDs produce power loss and the latter leads to heating of the lamp, it is necessary for sufficiently large heat sinks for adequate heat dissipation and correspondingly lower temperatures of the LED lamp to be provided. These problems with regard to heat dissipation are reflected, in particular, in that given the existing restricted overall space and also optimized heat sinks only a limited quantity of power loss can be output to the surroundings, and so there is a limit to the overall light quantity which can be produced by a retrofit LED lamp.

It is an object of the present invention to propose an improved retrofit LED lamp.

SUMMARY OF THE INVENTION

According to the invention, this object is achieved by the features of the independent claims, the independent claims developing the central idea for the invention in a particularly advantageous way.

A first aspect of the invention relates to an LED lamp with white light emission similar to a domestic candle, having an LED module consisting of at least one colour-converted blue or UV LED, and at least one monochromatic LED, preferably a red LED, in which case the mixed spectrum produces white light with an assigned colour temperature of between 1500K and 2400K, preferably 1700K and 2100K, at room temperature, and between 1800K and 2400K, preferably 2100K and 2300K, at a stationary operating temperature of for example, between 70° C. and 80° C. of the LED lamp.

This white light is "warmer" than a typical incandescent lamp light and is comparable to the colour temperature of candles or strongly dimmed incandescent lamp light.

The LED lamp can have an E27 threaded lamp cap.

The LED lamp can, in particular, have a reflector which surrounds the LED module annularly.

The monochromatic LED can have a dominant wavelength of between 600 nm and 635 nm.

The LED lamp can have a colour reproduction index CRI of more than 75, preferably more than 80, even more preferably more than 85.

A transparent layer can cover both the blue LED and the red LED in drop-like fashion, the transparent layer over the red LED not having a colour conversion material, even if this is not excluded.

The LED lamp can, in particular, be configured as a halogen or incandescent bulb retrofit lamp and have a driver circuit in a housing, as well as a cap for mechanical fastening in the manner of a halogen lamp or of an incandescent bulb and for supplying a DC or AC voltage.

The LED lamp can have one or more colour-converted, and one or more monochromatic LEDs on a printed circuit board (or a plurality of printed circuit boards), the selection requiring to be carried out by adjusting the correlated colour temperature to be achieved with the aid of performance data of the LEDs to be used and colour conversion material.

The LED lamp can have an efficiency at room temperature of more than 80 lm/W, preferably more than 85 lm/W, given an LED current of more than 300 mA, for example 350 mA.

The colour-converted LED can generate a light flux of more than 120 lm @350 mA operating current. The monochromatic, in particular red LED can generate a light flux of more than 50 lm @350 mA operating current. It follows that at room temperature (25° C.) and with an operating current of 350 mA the overall light flux of the LED lamp can be more than 340 lm for both LED types when two LEDs are present on the common substrate from either LED type.

The invention also relates to an LED lamp having an LED module consisting of at least one colour-converted blue or UV LED, and at least one red LED, in the case of which the mixed spectrum produces white light with a colour temperature CCT below 2500K, and in addition to a primary, yellow-emitting colour conversion material the colour conversion material has a further colour conversion material with a red or green emission spectrum, with the aid of which the limits of the resulting assigned colour temperature can be adapted to the target colour temperature, and, given the use of a UV LED, a third colour conversion material which emits in the blue region.

BRIEF DESCRIPTION OF THE DRAWINGS

A preferred exemplary embodiment of the invention is now described with reference to the figures, in which.

DETAILED DESCRIPTION OF THE INVENTION

It is relatively difficult in the case of a retrofit LED lamp to attain a white light with very low colour temperature (CCT) of, for example, 1800K to 2400K, particularly when the colour reproduction index CRI and also the efficiency (measured in lumen/watt, for example) are to be kept high. One possibility would certainly be to combine a green, a yellow and a red colour conversion material with a blue LED. However, a disadvantage of such a solution would be that the overall efficiency would be very low because of the spectral limitations of red phosphors which can be used, and it is impossible to generate attractive useful solutions partially owing to the restricted overall space and the restricted cooling performance.

The invention therefore basically provides to use a colour-converted blue or UV LED with a very high conversion efficiency, specifically preferably with a colour conversion material ('phosphor'), as it is used in the case of standard white light LED lamps with a colour temperature of, for example, 6500K, but that the blue light is virtually completely converted into colour-converted light.

The colour-converted LED used in accordance with the invention can have an efficiency in the range of 90-120% of an LED with a colour temperature of 6500K.

As has been said, this colour-converted blue LED is combined in accordance with the invention with a monochromatic, in particular red LED so as to result in a mixed spectrum of the LED module with a colour location in the vicinity of, or on the Planck curve specifically, as mentioned, with an efficiency which is close to a white light LED lamp used in a standard fashion with a colour temperature of 6500K, for example.

The red LED can have, for example, a dominant wavelength (peak) in the range from 600 nm to 635 nm.

Figure 1:
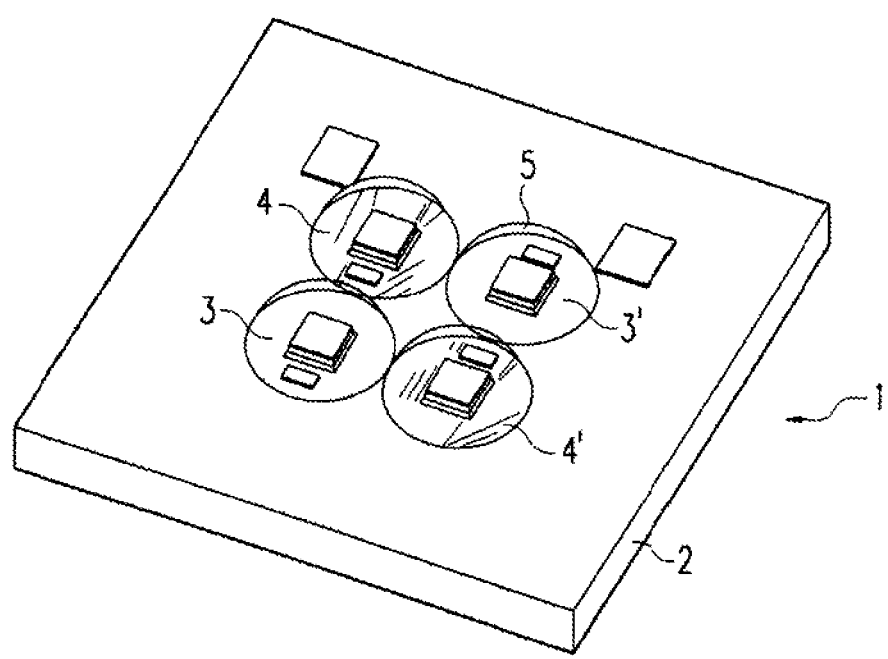
FIG. 1 shows an LED module for a retrofit LED lamp.

As may be seen from the first figure of the drawings, it is possible to make use in an inventive retrofit LED lamp of an LED module 1 which uses a printed circuit board (PCB) 2 as substrate. In the illustration according to FIG. 1, a total of four LEDs are provided, specifically two blue colour-converted LEDs 3, 3' and two monochromatic, preferably red LEDs 4, 4'.

A drop-like transparent layer 5 is preferably arranged over all the LEDs 3, 3', 4, 4'.

The LED lamp also preferably has a lamp cap for making mechanical and electrical contact between the LED lamp and a lamp holder, it being possible for the lamp cap to be an E14, E17 or E27 fitted cap, or a G4, G5 or G6 pin cap or a BA9 or BA15 bayonet cap.

A doped YAG:Ce can be used as colour conversion material. If appropriate, it is possible to add, at least in a relatively small quantity, a second type of colour conversion material such as, for example, an orange/red colour conversion material with an emission peak of between 590 nm-650 nm, or a green colour conversion material with an emission peak of between 500 nm and 540 nm. The second type of colour conversion material can be added, at least in a relatively small quantity, such as, for example, a nitride-based red colour conversion material, for example with an emission peak at 650 nm. This second colour conversion material with an emission spectrum whose peak wavelength is separated by at least 5 nm, preferably 10 nm or 15 nm, from the dominant wavelength of the red LED, which is in the range from 600 nm to 635 nm, discussed above.

The surface of the substrate 2 can be coated with a highly reflecting layer ("white coating"). This highly reflecting layer extends along the border of the LED chip at least in the region which is coated with the encapsulating layer 5. This highly reflecting layer can contain pigments, for example from TiO2, BaSO3, ZrO2, BaTiO3, by way of illustration.

Figure 2:
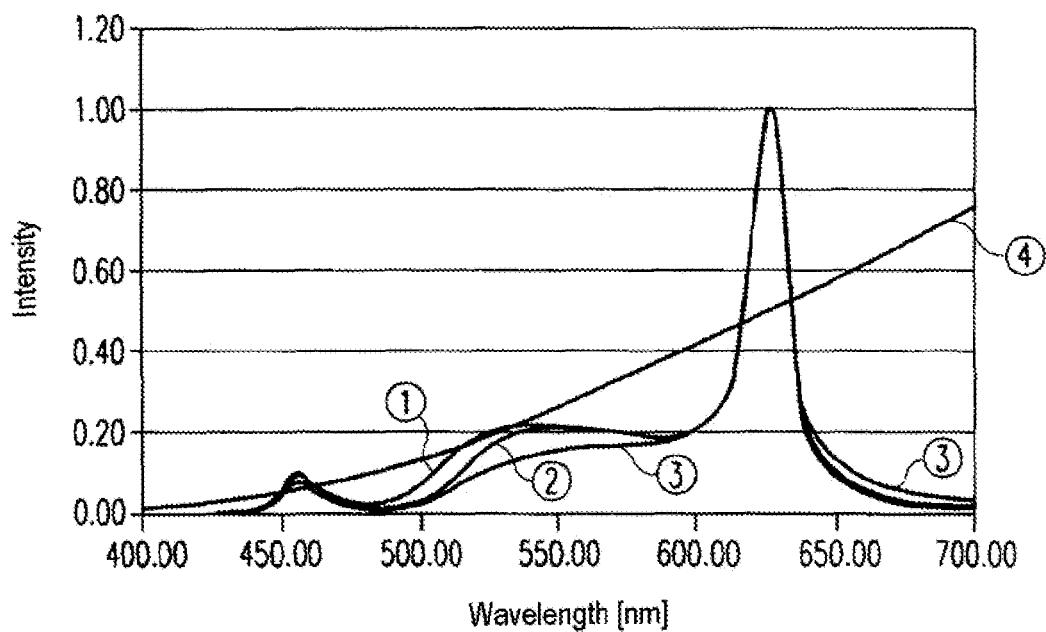
FIG. 2 shows the spectrum of various inventive LED modules by comparison with the spectrum of candle light.

FIG. 2 shows the spectrum of various inventive LED modules by comparison with the spectrum of candle light. The following exemplary embodiments for the LEDs of the LED module are illustrated here by comparison with the candle spectrum:

Example 1: Red LED and blue LED, with green/yellow phosphor

Example 2: Red LED and blue LED, with yellow phosphor

Example 3: Red LED and blue LED, with yellow/red phosphor

The invention claimed is:

1. LED lamp, having an LED module with at least one color-converted blue or UV LED, and at least one monochromatic red LED, wherein the mixed spectrum of said at least two LEDs is white light with a color temperature of between 1500K and 2400K at room temperature and a color temperature of between 1800K and 2400K at a stationary operating temperature of between 70° C. and 80° C. of the LED lamp, and wherein a primarily yellow-emitting color conversion material is associated with the blue or UV LED to convert light emitted from the blue or UV LED, wherein a second nitride-based red color conversion material is also associated with the blue or UV LED to convert light emitted from the blue or UV LED to a light whose peak wavelength is separated by at least 5 nm from a dominant wavelength of the monochromatic red LED.

2. LED lamp according to claim 1, having a reflector.

3. LED lamp according to claim 1, in which the dominant wavelength of the monochromatic LED is between 600 nm and 635 nm.

4. LED lamp according to claim 1, having a color reproduction index CRI of more than 75.

5. LED lamp according to claim 1, in which a transparent layer covers both the blue LED and the red LED in drop-like fashion.

6. LED lamp according to claim 1, which is configured as a halogen or incandescent bulb retrofit lamp, and has a driver circuit in a housing, as well as a cap for mechanical fastening in the manner of a halogen lamp or of an incandescent bulb and for supplying a DC or AC voltage.

7. LED lamp according to claim 1, which has two color-converted and two monochromatic LEDs on a printed circuit board PCB.

8. LED lamp according to claim 1, having an efficiency at room temperature of more than 80 lm/W given an LED current of more than 300 mA.

9. LED lamp according to claim 1, in the case of which YAG is not used as color conversion material.

10. LED lamp according to claim 1, in a case of which the surface of the common substrate of the LEDs is coated with a reflective layer.

11. LED lamp, having an LED module consisting essentially of at least one color-converted blue or UV LED, and at least one red LED, wherein a mixed spectrum produces white light with a color temperature below 2500K, and in addition to a primary yellow-emitting color conversion material the color conversion material has a further color nitride-based red conversion material with a red emission spectrum whose peak wavelength is separated by at least 5 nm from a dominant wavelength of the red LED, wherein both color conversion materials are associated with the blue or UV LED to convert light emitted from the blue or UV LED.

12. LED lamp according to claim 1, wherein the mixed spectrum of the at least two LEDs mentioned is white light with a color temperature of between 1700K and 2100K at room temperature and a color temperature of between 2100K and 2300K at a stationary operating temperature.

13. LED lamp according to claim 1, wherein the primary yellow-emitting color conversion material is a green/yellow emitting phosphor, a yellow emitting phosphor or a yellow/red emitting phosphor.

14. LED lamp according to claim 11, wherein the peak wavelength of the red emission spectrum of the further color conversion material is separated by at least 10 nm from the dominant wavelength of the red LED.

15. LED lamp according to claim 11, wherein the peak wavelength of the red emission spectrum of the further color conversion material is separated by at least 15 nm from the dominant wavelength of the red LED.

16. The LED lamp of claim 1, wherein the peak wavelength of the emission spectrum of the second color conversion material is separated by at least 10 nm from the dominant wavelength of the monochromatic red LED.

17. The LED lamp of claim 1, wherein the peak wavelength of the emission spectrum of the second color conversion material is separated by at least 15 nm from the dominant wavelength of the monochromatic red LED.

* * * * *